United States Patent
Wang et al.

(10) Patent No.: US 7,626,527 B1
(45) Date of Patent: Dec. 1, 2009

(54) CONTINUOUS TIME SIGMA-DELTA ANALOG-TO-DIGITAL CONVERTER WITH STABILITY

(75) Inventors: Dejun Wang, Irvine, CA (US); Hassan Elwan, Lake Forest, CA (US)

(73) Assignee: Newport Media, Inc., Lake Forest, CA (US)

( * ) Notice: Subject to any disclaimer, the term of this patent is extended or adjusted under 35 U.S.C. 154(b) by 9 days.

(21) Appl. No.: 12/169,763

(22) Filed: Jul. 9, 2008

(51) Int. Cl.
*H03M 3/00* (2006.01)
(52) U.S. Cl. .................. 341/143; 341/155
(58) Field of Classification Search .......... 341/143–155
See application file for complete search history.

(56) References Cited

U.S. PATENT DOCUMENTS

| | | | | |
|---|---|---|---|---|
| 5,977,895 | A * | 11/1999 | Murota et al. .......... | 341/143 |
| 6,686,864 | B1 * | 2/2004 | Moreland ............... | 341/155 |
| 6,697,002 | B2 * | 2/2004 | Sekiya et al. .......... | 341/143 |
| 2006/0092061 | A1 | 5/2006 | Jensen | |

* cited by examiner

*Primary Examiner*—Lam T Mai
(74) *Attorney, Agent, or Firm*—Rahman LLC

(57) ABSTRACT

A continuous time sigma-delta analog-to-digital converter (CT ΣΔADC) including an integrator, which includes an operational amplifier having at least one input terminal that receives an input signal, a feedback mechanism operatively connected to the operational amplifier, at least one capacitor coupled to the operational amplifier and the feedback mechanism, a reset switch coupled to the at least one capacitor, the operational amplifier, and the feedback mechanism, and a single directional voltage-to-current converter coupled to the input terminal. The single directional voltage-to-current converter translates a differential signal voltage only to a differential signal current. The reset switch resets the feedback mechanism. The single directional voltage-to-current converter behaves a one-directional resistor. The integrator prevents current generation when there is a non-linear disturbance at the input terminal of the operational amplifier. The single directional voltage-to-current converter clips an input current that exceeds a threshold value.

20 Claims, 5 Drawing Sheets

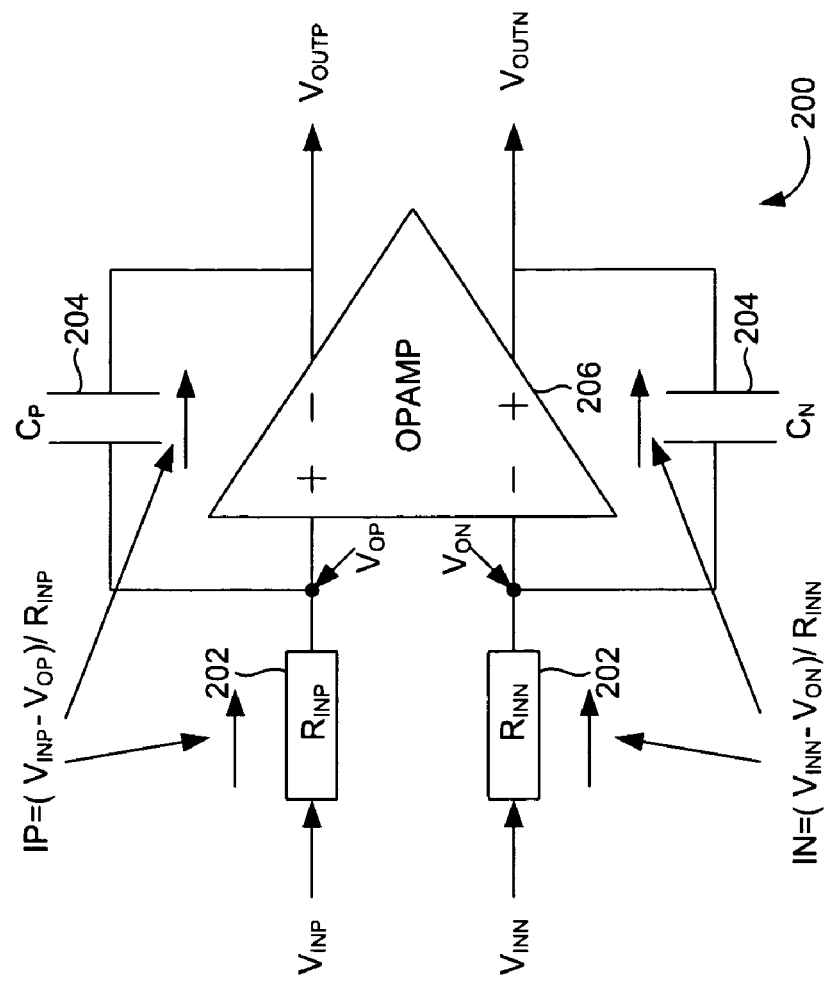
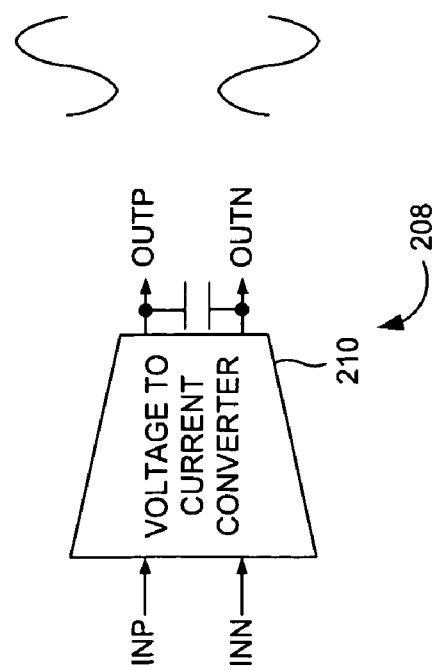
FIG. 2A
FIG. 2B

CONTINUOUS TIME SIGMA-DELTA ANALOG-TO-DIGITAL CONVERTER WITH STABILITY

BACKGROUND

1. Technical Field

The embodiments herein generally relate to electrical circuits, and, more particularly, to sigma-delta loop filter circuits.

2. Description of the Related Art

A Sigma-Delta Analog-to-Digital Converter (ΣΔADC) typically includes a loop filter, a quantizer, and a feedback Digital-to-Analog Converter (DAC). Sigma-Delta Analog-to-Digital Converters may be continuous time or discrete time converters, the distinction between the two types being in the implementation of the loop filter. In a Continuous Time Sigma-Delta (CT-SD) ADC, the loop filter is built using components that don't need a clock to operate, such as (a) resistor, capacitors and opamps, (b) voltage-to-current converters, or (c) inductor and capacitors etc. The loop filter behavior can be characterized by its corresponding s-domain transfer function. The Discrete Time Sigma-Delta (DT-SD) ADC involves clocked switches and its loop filter characteristics are best described with its z-domain transfer function.

Anti-aliasing is a technique of minimizing the aliasing effects (distortion or artifact that results when a signal is sampled and reconstructed as an alias of the original signal) caused by components of the signal and noise with frequencies of half or more of a sampling rate. In discrete-time Sigma-Delta converters, an anti-aliasing filter is needed to filter out all unwanted signal above half of the clock frequency. As a contrary, the continuous Sigma-Delta ADC has an inherent anti-aliasing function built into the loop filter and it doesn't require a separate anti-aliasing filter in front of it which is very attractive to many applications.

Due to the sampling action of the clocked loop filters, discrete-time Sigma Delta ADC's building blocks such as opamps and reference has to be very fast to settle within one clock period so as not to introduce additional errors. This limits its maximum clock frequency and as a consequence its obtainable signal bandwidth. In contrast, continuous-time loop filters expand new application possibilities as it enables the use of a much faster system clock to increase signal bandwidth.

FIG. 1 is a typical ΣΔADC 100 having a loop filter 102, a quantizer 104, and a feedback DAC 106. The loop filter 102 receives input, IN, performs signal processing (e.g., removes unwanted signal components and/or enhances desired signal components), and sends its output signal Y to the quantizer 104. The loop filter 102 passes low-frequency signals and attenuates (reduces the amplitude of) signals with frequencies higher than a cutoff frequency. The loop filter 102 provides large gain within a signal band of interest. The loop filter 102 may be implemented using an integrator (not shown).

The quantizer 104 receives the output signal Y from the loop filter 102 as its input signal and quantizes the received input signal (e.g., converts the discrete signal into digital signal). The quantizer 104 divides a continuous range of values of a wave into a finite number of sub-ranges. Each sub-range of the wave may be represented by an assigned or quantized value. The digital signal obtained from the quantizer 104 is received by the feedback DAC 106, which then converts it into an analog signal that is fed to the loop filter 102 as an input signal. The integrator used to realize the loop filter 102 may be based either (i) on resistors, capacitors, and an op-amp, or (ii) on a voltage-to-current converter and capacitors.

FIG. 2A is a differential integrator circuit 200 based on a voltage-to-current converter (Gm) 202 and capacitors ($C_P$ and $C_N$) 204. FIG. 2B is a conventional differential integrator circuit 210 based on capacitors ($C_P$ and $C_N$) 204, an op-amp 206, and resistors ($R_{INP}$ and $R_{INN}$) 208 illustrating the vulnerability of the circuit 210 to disturbance at the input of the op-amp 206. The resistors ($R_{INP}$ and $R_{INN}$) 208 receive the inputs $V_{INP}$ and $V_{INN}$ and produce current according to the voltage across it and the current then get integrated on the capacitor Cp and Cn to produce the outputs $V_{OUTP}$ and $V_{OUTN}$. According to the following equations: $V_{OUTP} - V_{OUTN} = -(V_{INP} - V_{INN})/sRC + (V_{OP} - V_{ON})(1 + 1/sRC)$, where R is the value of resistor $R_{INP}$ and $R_{INN}$ and C is the value of capacitor Cp and Cn.

So it is clear that non-linear signal content at the op-amp's input will produce distortion at the integrator output. Further, the output of the DAC 106 (of FIG. 1) (e.g., output from the quantizer 104) is an analog representation of digital signal so it is normally a step signal with sharp rising edges. If the step size is big, it will excite the first integrator 210 and causes the op-amp 206 in the first integrator 210 to undergo a transient process of slewing. During this process, the op-amp 206 exhibits strong non-linear behavior and non-linearity is translated into current and becomes integrated by the capacitor 204 to show up at the output.

This leads to distortion at the integrator output. This is a major bottleneck of the conventional differential integrator circuit 210 when it comes to signal to distortion. Thus, the conventional differential integrator circuit 210 is vulnerable to disturbance at the input of the op-amp 206. In addition to that, the anti-aliasing performance of the conventional differential integrator circuit 210 is degraded as the finite op-amp gain causes the integrator 210 to deviate from its ideal 1/s frequency response.

In a ΣΔADC with an order higher than 2 (e.g., third order configuration), the ADC may go unstable when the input exceeds certain maximum range. This affects system reliability. Therefore, in order to have a stable ADC, typically the loop filter may have to be reset or to limit the input signal within a certain range using an additional circuit element (e.g., an automatically controlled gain loop) to ensure that the input signal range is never higher than the stability threshold.

For low noise Sigma Delta ADC, there is a very tight demand for a previous stage's driving capability. For example, for a 1-volt peak-to-peak differential input signal, a 86 dB dynamic range within a 4 MHz band dictates a 4,700 ohm input resistance, if implemented using the traditional method, whereby the preceding stage typically has to provide 0.1 mA when driving the ADC with a full 1-volt signal swing. This is normally too much current load for the previous stage without a buffer. Thus the conventional approach for low noise ADC normally also implies a buffer in between the previous stage driving into the ADC. So a continuous time Sigma Delta ADC with capacitive input impedance, inherent stability and immunity to opamp's virtual ground bounce is highly desired.

SUMMARY

In view of the foregoing, an embodiment herein provides a continuous time sigma-delta analog-to-digital converter (CT ΣΔADC) including an integrator. The integrator includes an operational amplifier having at least one input terminal that receives an input signal, a feedback mechanism operatively connected to the operational amplifier, at least one capacitor coupled to the operational amplifier and the feedback mechanism, a reset switch coupled to the at least one capacitor, the operational amplifier, and the feedback mechanism, and a single directional voltage-to-current converter coupled to the input terminal. The single directional voltage-to-current converter translates a differential signal voltage only to a differential signal current. The reset switch resets the feedback mechanism.

The single directional voltage-to-current converter behaves as a one-directional resistor. The integrator prevents current generation when there is a non-linear disturbance at the input terminal of the operational amplifier. The single directional voltage-to-current converter clips an input current that exceeds a threshold value. The threshold value is determined based on a modulation index of the CT ΣΔADC, which is the maximum input stability range of the CT ΣΔADC when referring to the reference voltage. The single directional voltage-to-current converter provides a variable transconductance.

The CT ΣΔADC further includes a quantizer operatively connected to the integrator, and a plurality of DACs operatively connected to the integrator. The single directional voltage-to-current converter provides capacitive input impedance to a previous stage of the integrator.

In another aspect, a CT ΣΔADC including an integrator is provided. The integrator including an operational amplifier having at least one input terminal that receives an input signal, and at least one capacitor coupled to the operational amplifier, a single directional voltage-to-current converter coupled to the input terminal, the single directional voltage-to-current converter prevents current generation when there is a non-linear disturbance at the input terminal of the operational amplifier, and the single directional voltage-to-current converter clips an input current that exceeds a threshold value, a quantizer operatively coupled to the integrator to receive an output signal, and at least one DAC to receive an output signal from the quantizer and feed an input current to the integrator.

The single directional voltage-to-current converter behaves as a one-directional resistor. The threshold value is determined based on a modulation index of the CT ΣΔADC. The single directional voltage-to-current converter provides a variable transconductance. The single directional voltage-to-current converter provides capacitive input impedance to a previous stage of the integrator.

Another embodiment provides a method of operation of a first integrator of a CT ΣΔADC, the first integrator including an operational amplifier, a voltage-to-current converter, and a capacitor. The method includes translating a differential signal voltage only to a differential signal current, such that no current is generated when there is a non-linear disturbance at an input of the operational amplifier, and adjusting a transconductance of the voltage-to-current converter to relax a dynamic range of the CT ΣΔADC.

The voltage-to-current converter behaves a one-directional resistor. The CT ΣΔADC may be implemented using complementary metal-oxide-semiconductor (CMOS) means. The voltage-to-current converter provides capacitive input impedance to a previous stage of the first integrator. An input current may be clipped when the input current exceeds a threshold value. The threshold value is determined based on a modulation index of the CT ΣΔADC. By varying the trans-conductance, a variable gain amplifier is effectively implemented in front of the CT ΣΔADC.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 2A is a schematic diagram of a conventional differential integrator circuit based on a voltage-to-current converter and capacitors;

FIG. 2B is a schematic diagram of a conventional differential integrator circuit based on capacitors, an op-amp, and resistors;

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Figure 1:
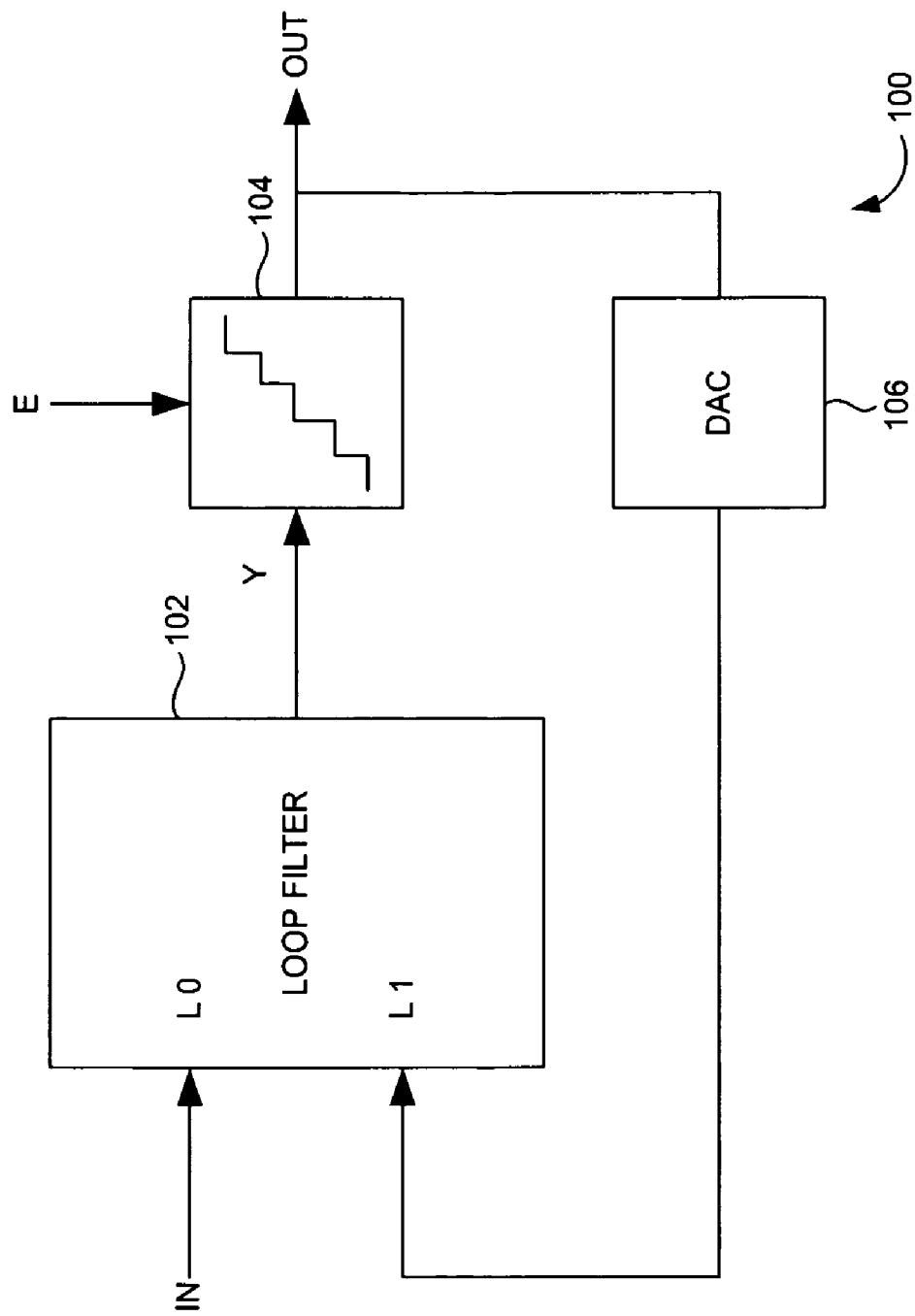
FIG. 1 is a schematic diagram of a conventional ΣΔADC.
Figure 3:
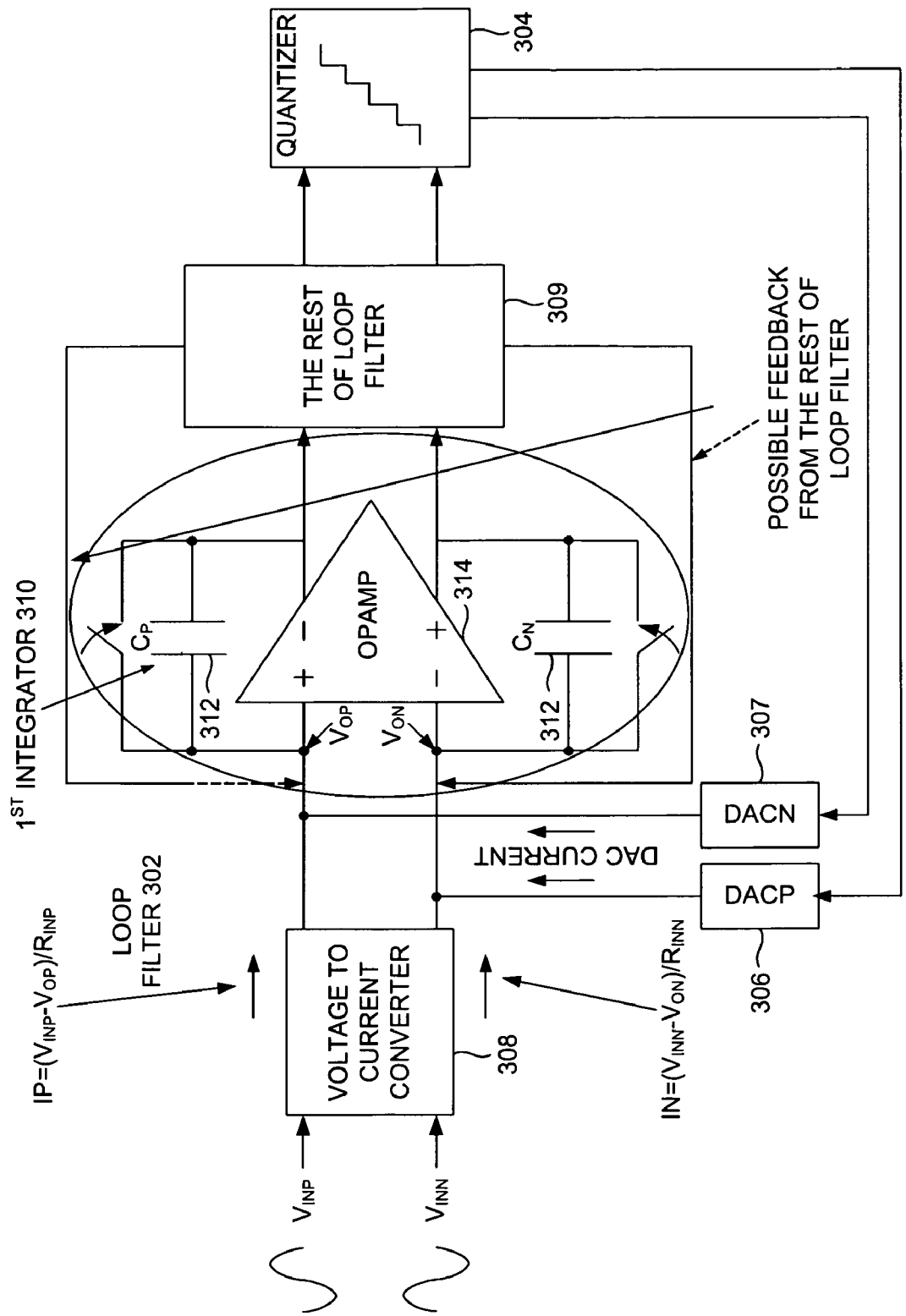
FIG. 3 illustrates a continuous time ΣΔADC according to an embodiment herein.
Figure 4:
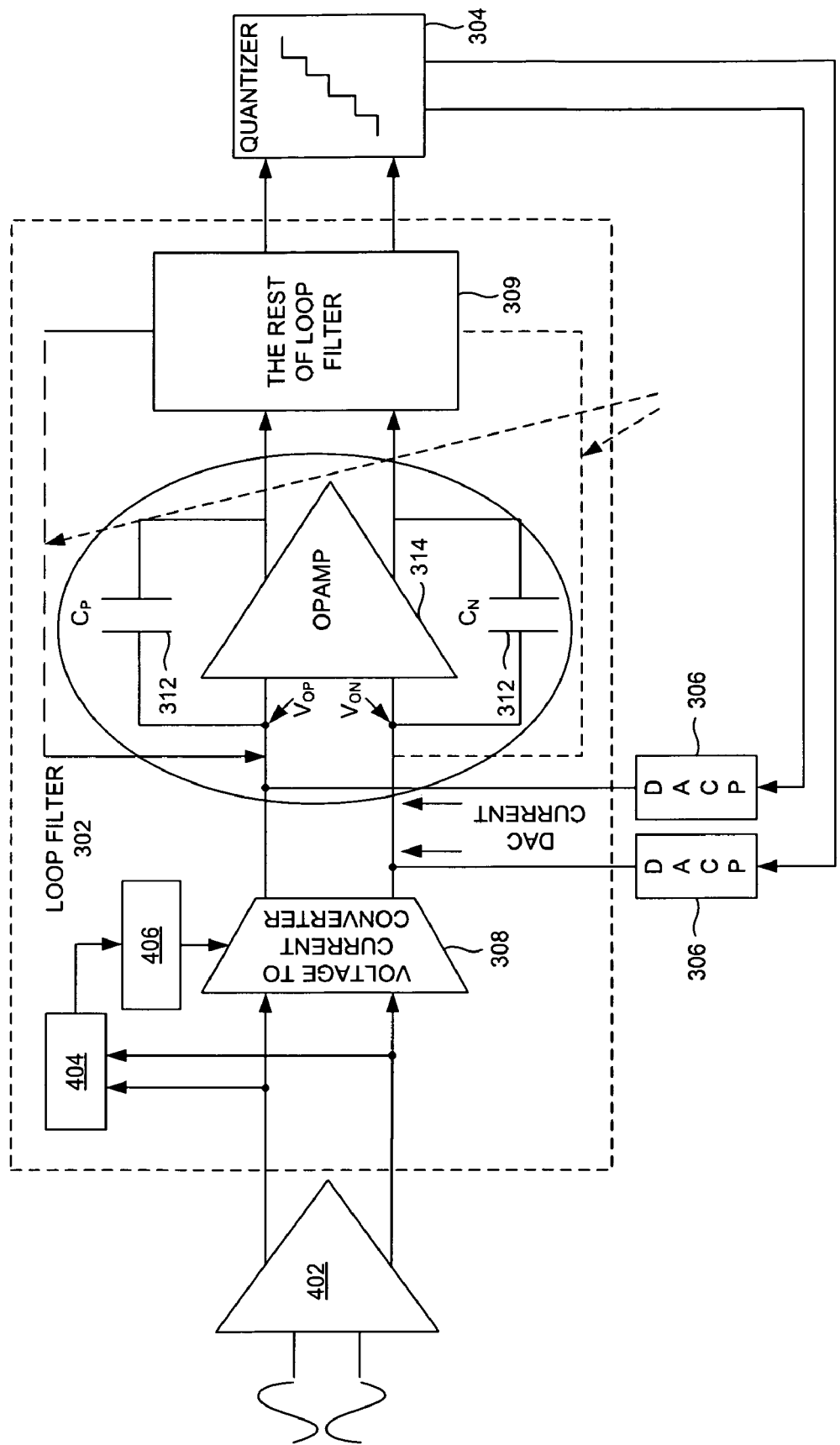
FIG. 4 illustrates a circuit diagram of the continuous time ΣΔADC of FIG. 3 having the loop filter, the quantizer, the feedback DACs (DACP and DACN), with a preceding stage according to an embodiment herein.
Figure 5:
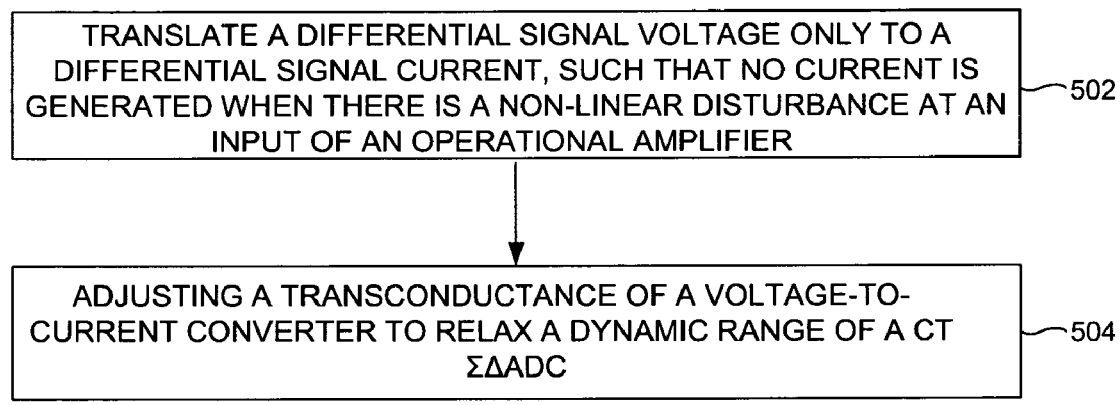
FIG. 5 is a flow diagram illustrating a method of operation of a first integrator of the continuous time sigma-delta analog-to-digital converter (CT ΣΔADC) according to the embodiments herein.

As mentioned, there remains a need for a continuous time ΣΔADC with less vulnerability to disturbance and has inherent stability. The embodiments herein achieve this by using a current limited voltage-to-current converter instead of resistor in the first integrator of the loop filter within the ΣΔADC. Due to the one directional nature of the voltage-to-current converter, differential input voltage Vinp−Vinn converts into a differential current according to $Ip=gm*(V_{INP}-V_{INN})$ and $In=-gm*(V_{INP}-V_{INN})$ and inject the current into the input terminal of the opamp. But the opamp's non-linear input disturbance now will not translate into a non-linear current due to the one directional nature of the voltage-to-current converter. Also the voltage-to-current converter inherently provides a capacitive input impedance and with current limiting capability, the stability of the ADC is guaranteed. This is a big improvement over conventional resistor approach as there is no way to limit the current across a simple resistor and that is main reason the ΣΔADC will become unstable under large input signal. Referring now to the drawings, and more particularly to FIGS. 3 through 5, where similar reference characters denote corresponding features consistently throughout the figures, there are shown preferred embodiments.

FIG. 3 illustrates a continuous time $\Sigma\Delta$ADC 300 having a loop filter 302, a quantizer 304, and feedback DACs (DACP 306 and DACN 307), according to an embodiment herein. The loop filter 302 includes voltage-to-current converter 308 and first integrator 310. The first integrator 310 includes capacitors ($C_P$ and $C_N$) 312, an op-amp 314, and reset switches 316. The capacitors ($C_P$ and $C_N$) 312 and the reset switches 316 are connected in parallel to the op-amp 314. In one embodiment, the voltage-to-current converter 308 is embodied as a one directional resistor operatively connected to an input terminal. The voltage-to-current converter 308 takes input in the form of voltage and converts it to an output current.

The voltage-to-current converter 308 translates a differential signal voltage only to a differential signal current. Examples of voltage-to-current translation include differential pairing and using high linearity transconductance. The voltage-to-current converter 308 clips an input current that exceeds a threshold value. Typically, in voltage-to-current conversion there is a tail current and the conversion is operated in differential mode, by using a tail current that is less than the minimum current that will cause the ADC to go unstable. The embodiments herein provide that the input current is always within the stability bound and the ADC is always stable.

The current is effectively clipped within a safe region. Thus, even when the input exceeds the range that the loop filter 309 can handle in the conventional resistor case, according to the embodiments herein since the maximum current that can be converted is clipped, no instability will occur. In addition, the voltage-to-current converter 308 may be programmed to provide a variable transconductance. This provides a floating ADC that is optimum for the continuous time $\Sigma\Delta$ADC 300.

This is optimum because varying the transconductance effectively adds gain into the system. For example, if the initial transconductance is gm and is varied to 1.5 times gm, this means 1.5× in gain is added. By doing this, the embodiments herein adjust the transconductance so that the input to the $\Sigma\Delta$ADC 300 is not too small so that it is too close to the noise floor or too big so as to cause distortion to happen, which is effectively trying to program the amplitude into the $\Sigma\Delta$ADC 300 to be at an optimum level. The voltage-to-current converter 308 adjusts a transconductance of the continuous time $\Sigma\Delta$ADC 300 for relaxing a dynamic range. In voltage-to-current conversion, the transconductance can be determined by a tail current if it is a simple differential pair, or by changing the resistor value if it is a degenerated differential pair, etc.

In an example embodiment, if a maximum signal is 1-volt peak-to-peak differential and needs to detect a signal of 35 μV with a dynamic range of 80 dB, the input transconductance can be switched to provide 20 dB and the dynamic range relaxes to 60 dB. This involves utilizing a device that can detect the peak amplitude of the signal input and use an automatic gain control loop to regulate the transconductance to provide an effective 20 dB gain to the system. This provides power and area savings.

In one example embodiment, a simple calculation shows that if a ADC that has 80 dB dynamic range within a 4 MHz bandwidth for a maximum amplitude of 1 volt is designed then the noise floor has to be lower than 17.5 nv/sqrt(Hz), while a 60 dB dynamic range ADC under that same condition requires a noise floor of 175 nV/sqrt(Hz), if noise is thermal limited. The 60 dB ADC's input resistor can be 100× times more than the 80 dB ADC. This can translate to less capacitance area for the same loop bandwidth and much less power for opamps etc.

Accordingly, if an 80 dB AC is designed, it requires state of the art technique, knowledge and careful planning and testing of the circuits, while a 60 dB design is relatively much easier and less risk. The rest of the loop filter 309 provides a possible feedback mechanism to the inputs of the integrator 310. The loop filter 309 can be reset (e.g., using a reset switch 316). This will close to reset the loop filter 309 with a reset signal. The input signal is maintained within a certain range with an automatic gain control (AGC) loop by constantly monitoring the input signal of the $\Sigma\Delta$ADC 300. If it falls below certain range, then the transconductance value may be changed accordingly.

FIG. 4 illustrates a circuit diagram of the continuous time $\Sigma\Delta$ADC 300 of FIG. 3 having the loop filter 302, the quantizer 304, the feedback DACs (DACP 306 and DACN 307), with a preceding stage according to an embodiment herein. The preceding stage includes a post mixer amplifier 402, an amplitude detection block 404, and a transconductance block 406, according to an embodiment herein. The post mixer amplifier 402 drives into the $\Sigma\Delta$ADC 300 which will relax the driving capability of the post mixer amplifier 402 and provide sufficient power to drive when it comes to wide bandwidth and also relaxes the required dynamic range.

The preceding stage (e.g., the post mixer amplifier 402) drives the input terminal of the voltage-to-current converter 308 which is the gate of the active circuitry (e.g., MOS). The gate terminal is purely a capacitive. The preceding stage has only the capacitive loading instead of a resistive loading. Thus, by changing the transconductance, the dynamic range is relaxed. The amplitude detection block 404 detects the amplitude at the input terminals of the voltage-to-current converter 308. The transconductance control block 406 controls the dynamic range by changing the value of transconductance.

FIG. 5, with reference to FIGS. 3 and 4, is a flow diagram illustrating a method of operation of a first integrator 310 of the CT $\Sigma\Delta$ADC 300 according to an embodiment herein. In step 502, a differential signal voltage is translated only to a differential signal current, such that no current is generated when there is a non-linear disturbance at an input of the operational amplifier. In step 504, a transconductance of the voltage-to-current converter 308 is adjusted to relax a dynamic range of the CT $\Sigma\Delta$ADC 300. The voltage-to-current converter 308 behaves as a one-directional resistor. Alternatively, the CT $\Sigma\Delta$ADC 300 may be implemented using CMOS means. An input current may be clipped when the input current exceeds a threshold value. The threshold value is determined based on a modulation index of the CT $\Sigma\Delta$ADC 300. A variable gain amplifier 402 may be effectively implemented in front of the CT $\Sigma\Delta$ADC 300 by varying the trans-conductance.

The embodiments herein can include both hardware and software elements. The embodiments that are implemented in software include but are not limited to, firmware, resident software, microcode, etc. Moreover, the techniques provided by the embodiments herein may be implemented on an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The ΣΔADC circuit 300 may be used to increase the performance of the complete system. The embodiments herein solve the problem providing capacitive input, immunity to disturbance at the input of the op-amp 314 (virtual ground bounce), and simultaneously provides inherent stability improvement for the overall system. The voltage-to-current converter 308 senses input and produces a current to its output but does not react to any disturbance at its output terminal thus it has better immunity to virtual ground bounce than using a resistor (as in conventional devices).

The stability of the system is achieved when the input exceeds maximum range and the current delivered to the output is bounded. The embodiments herein also solve the problems of relaxing the preceding stage (e.g., using a post mixer amplifier 402) and provides sufficient power to drive capability when it comes to wide bandwidth and also relaxes the required dynamic range. In addition, by varying the transconductance of the voltage-to-current converter 308, an inherent variable gain amplifier 402 can be implemented in front of the ΣΔADC 300.

The ΣΔADC circuit 300 may also be used in implementing a saturation mechanism in the voltage-to-current converter 308 to clip the input current beyond a certain maximum range. The voltage-to-current conversion involves a differential pair. The tail bias current determines the maximum current that is able to deliver to the output. Thus, the maximum current from the voltage-to-current converter 308 is limited by controlling the tail current. Moreover, the ΣΔADC circuit 300 does not generate current when there is a non-linear disturbance at the input of the op-amp 314.

Furthermore, the ΣΔADC circuit 300 provides a capacitive input impedance to its previous stage (if the preceding stage does not have enough driving capability) when implemented in CMOS technology (e.g., a low noise ΣΔADC 300 having a wide bandwidth) as CMOS technology has purely capacitive gate input impedance and normally voltage-to-current conversion has a CMOS gate as its input terminal. The ΣΔADC circuit 300 provides a floating ADC that is optimum for the overall system it is integrated into by programming the voltage-to-current converter 308 to provide different transconductance values.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A continuous time sigma-delta analog-to-digital converter (CT ΣΔADC) comprising an integrator comprising:
    an operational amplifier having at least one input terminal that receives an input signal;
    a feedback mechanism operatively connected to said operational amplifier;
    at least one capacitor coupled to said operational amplifier and said feedback mechanism;
    a reset switch coupled to said at least one capacitor, said operational amplifier, and said feedback mechanism, wherein said reset switch resets said feedback mechanism; and
    a single directional voltage-to-current converter coupled to said input terminal, wherein said single directional voltage-to-current converter translates a differential signal voltage only to a differential signal current.

2. The CT ΣΔADC of claim 1, wherein said single directional voltage-to-current converter behaves as a one-directional resistor.

3. The CT ΣΔADC of claim 1, wherein said integrator prevents current generation when there is a non-linear disturbance at said input terminal of said operational amplifier.

4. The CT ΣΔADC of claim 1, wherein said single directional voltage-to-current converter clips an input current that exceeds a threshold value.

5. The CT ΣΔADC of claim 4, wherein said threshold value is determined based on a modulation index of said CT ΣΔADC.

6. The CT ΣΔADC of claim 1, wherein said single directional voltage-to-current converter provides a variable transconductance.

7. The CT ΣΔADC of claim 1, further comprising:
    a quantizer operatively connected to said integrator; and
    a plurality of digital-to-analog converters (DACs) operatively connected to said integrator.

8. The CT ΣΔADC of claim 7, wherein said single directional voltage-to-current converter provides capacitive input impedance to a previous stage of said integrator.

9. A continuous time sigma-delta analog-to-digital converter circuit (CT ΣΔADC) comprising:
    an integrator comprising:
        an operational amplifier having at least one input terminal that receives an input signal; and
        at least one capacitor coupled to said operational amplifier;
    a single directional voltage-to-current converter coupled to said input terminal, wherein said single directional voltage-to-current converter prevents current generation when there is a non-linear disturbance at said input terminal of said operational amplifier, and wherein said single directional voltage-to-current converter clips an input current that exceeds a threshold value;

a quantizer operatively coupled to said integrator to receive an output signal; and at least one digital-to-analog converter (DAC) to receive an output signal from said quantizer and feed an input current to said integrator.

10. The CT ΣΔADC of claim 9, wherein said single directional voltage-to-current converter behaves as a one-directional resistor.

11. The CT ΣΔADC of claim 9, wherein said threshold value is determined based on a modulation index of said CT ΣΔADC.

12. The CT ΣΔADC of claim 9, wherein said single directional voltage-to-current converter provides a variable transconductance.

13. The CT ΣΔADC of claim 9, wherein said single directional voltage-to-current converter provides capacitive input impedance to a previous stage of said integrator.

14. A method of operation of a first integrator of a continuous time sigma-delta analog-to-digital converter (CT ΣΔADC), said first integrator comprising an operational amplifier, a voltage-to-current converter, and a capacitor, said method comprising:

translating a differential signal voltage only to a differential signal current, such that no current is generated when there is a non-linear disturbance at an input of said operational amplifier; and adjusting a transconductance of said voltage-to-current converter to relax a dynamic range of said CT ΣΔADC.

15. The method of claim 14, wherein said voltage-to-current converter behaves as a one-directional resistor.

16. The method of claim 14, further comprising implementing said CT ΣΔADC using complementary metal-oxide-semiconductor (CMOS) means.

17. The method of claim 16, wherein said voltage-to-current converter provides capacitive input impedance to a previous stage of said first integrator.

18. The method of claim 14, further comprising clipping an input current when said input current exceeds a threshold value.

19. The method of claim 18, wherein said threshold value is determined based on a modulation index of said CT ΣΔADC.

20. The method of claim 14, further comprising effectively implementing a variable gain amplifier in front of said CT ΣΔADC.

* * * * *